United States Patent
Saito et al.

(10) Patent No.: US 11,217,431 B2
(45) Date of Patent: Jan. 4, 2022

(54) METHOD OF MANUFACTURING SEMICONDUCTOR DEVICE AND SEMICONDUCTOR MANUFACTURING APPARATUS

(71) Applicant: Toshiba Memory Corporation, Tokyo (JP)

(72) Inventors: Ryuichi Saito, Kawasaki Kanagawa (JP); Seiji Morita, Shinagawa Tokyo (JP); Ryosuke Yamamoto, Kawasaki Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 194 days.

(21) Appl. No.: 16/513,755

(22) Filed: Jul. 17, 2019

(65) Prior Publication Data

US 2019/0341229 A1 Nov. 7, 2019

Related U.S. Application Data

(62) Division of application No. 15/891,400, filed on Feb. 8, 2018, now Pat. No. 10,395,899.

(30) Foreign Application Priority Data

Sep. 13, 2017 (JP) .............................. JP2017-176082

(51) Int. Cl.
*H01L 21/027* (2006.01)
*H01J 37/32* (2006.01)
(Continued)

(52) U.S. Cl.
CPC ...... *H01J 37/32339* (2013.01); *G03F 7/0002* (2013.01); *G03F 7/0392* (2013.01);
(Continued)

(58) Field of Classification Search
CPC .. H01J 37/32339; H01J 37/3244; H01J 37/32; H01L 21/31144; H01L 21/0273;
(Continued)

(56) References Cited

U.S. PATENT DOCUMENTS

| | | |
|---|---|---|
| 4,613,398 A | 9/1986 | Chiong et al. |
| 8,980,418 B2 | 3/2015 | Darling et al. |
| 2009/0071404 A1* | 3/2009 | Tada ................ H01L 21/76843 |
| | | 118/723 ME |
| 2009/0298225 A1 | 12/2009 | Wu et al. |

(Continued)

FOREIGN PATENT DOCUMENTS

| | | |
|---|---|---|
| JP | S61-284924 A | 12/1986 |
| JP | H3-174724 A | 7/1991 |

(Continued)

*Primary Examiner* — Thanh T Nguyen
(74) *Attorney, Agent, or Firm* — Finnegan, Henderson, Farabow, Garrett & Dunner LLP.

(57) ABSTRACT

In one embodiment, a method of manufacturing a semiconductor device includes forming a first film on a substrate. The method further includes housing the substrate provided with the first film in a chamber, and introducing a first gas into the chamber. The method further includes generating plasma discharge of the first gas in the chamber or applying radiation to the first gas in the chamber. The method further includes introducing a second gas containing a metal component into the chamber to cause the metal component to infiltrate into the first film after the generation of the plasma discharge or the application of the radiation is started.

13 Claims, 10 Drawing Sheets

(51) Int. Cl.
*H01L 21/311* (2006.01)
*G03F 7/40* (2006.01)
*G03F 7/00* (2006.01)
*G03F 7/16* (2006.01)
*G03F 7/039* (2006.01)
*H01L 21/3105* (2006.01)

(52) U.S. Cl.
CPC ............. *G03F 7/167* (2013.01); *G03F 7/168* (2013.01); *G03F 7/405* (2013.01); *H01J 37/32* (2013.01); *H01J 37/3244* (2013.01); *H01L 21/0273* (2013.01); *H01L 21/31058* (2013.01); *H01L 21/31144* (2013.01)

(58) Field of Classification Search
CPC ............. H01L 21/027; H01L 21/31058; H01L 21/311; H01L 21/3105; G03F 7/405; G03F 7/0002; G03F 7/167; G03F 7/168; G03F 7/40; G03F 7/0392
See application file for complete search history.

(56) References Cited

U.S. PATENT DOCUMENTS

| | | |
|---|---|---|
| 2010/0081094 A1 | 4/2010 | Hasebe et al. |
| 2012/0241411 A1 | 9/2012 | Darling et al. |
| 2014/0256128 A1* | 9/2014 | Spurlin .................... C25D 5/42 438/643 |
| 2015/0263282 A1* | 9/2015 | Sung ...................... H01L 45/06 438/680 |
| 2015/0347035 A1 | 12/2015 | Padia et al. |
| 2016/0233084 A1 | 8/2016 | Chen et al. |
| 2017/0242335 A1 | 8/2017 | Chan et al. |
| 2017/0263439 A1 | 9/2017 | Hashimoto et al. |
| 2018/0068862 A1* | 3/2018 | Terakura ........... H01L 21/31144 |

FOREIGN PATENT DOCUMENTS

| | | |
|---|---|---|
| JP | H4-369220 A | 12/1992 |
| JP | 2003-155365 A | 5/2003 |
| JP | 2008-520833 A | 6/2008 |
| JP | 2012-204456 A | 10/2012 |
| JP | 2013-020973 A | 1/2013 |

* cited by examiner

METHOD OF MANUFACTURING SEMICONDUCTOR DEVICE AND SEMICONDUCTOR MANUFACTURING APPARATUS

CROSS REFERENCE TO RELATED APPLICATION

This application is a divisional application of U.S. patent application Ser. No. 15/891,400, filed on Feb. 8, 2018, which is based upon and claims the benefit of priority from the prior Japanese Patent Application No. 2017-176082, filed on Sep. 13, 2017, the entire contents of which are incorporated herein by reference.

FIELD

Embodiments described herein relate to a method of manufacturing a semiconductor device and a semiconductor manufacturing apparatus.

BACKGROUND

In a case of using an organic film as an etching mask, it is considered to infiltrate a metal gas into the organic film to enhance etching resistance of the organic film.

BRIEF DESCRIPTION OF THE DRAWINGS

FIGS. 1A to 2C are cross-sectional views illustrating a method of manufacturing a semiconductor device of a first embodiment;

FIGS. 5A to 7B are cross-sectional views illustrating operation of a semiconductor manufacturing apparatus of a second embodiment; and FIGS. 8A to 10 are cross-sectional views illustrating operation of a semiconductor manufacturing apparatus of a third embodiment.

DETAILED DESCRIPTION

Embodiments will now be explained with reference to the accompanying drawings.

In one embodiment, a method of manufacturing a semiconductor device includes forming a first film on a substrate. The method further includes housing the substrate provided with the first film in a chamber, and introducing a first gas into the chamber. The method further includes generating plasma discharge of the first gas in the chamber or applying radiation to the first gas in the chamber. The method further includes introducing a second gas containing a metal component into the chamber to cause the metal component to infiltrate into the first film after the generation of the plasma discharge or the application of the radiation is started.

First Embodiment

FIGS. 1A to 2C are cross-sectional views illustrating a method of manufacturing a semiconductor device of a first embodiment.

Figure 1A:
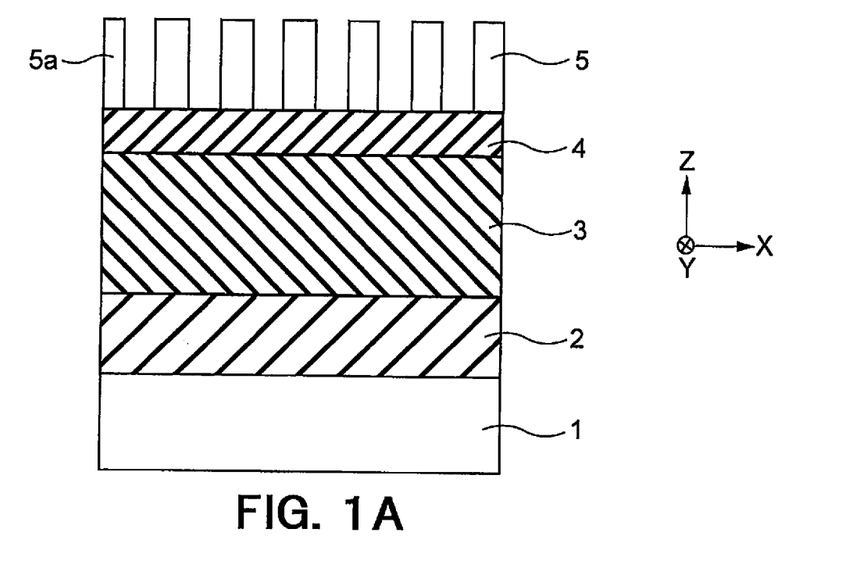

First, an inter layer dielectric 2 is formed on a substrate 1 (FIG. 1A). Examples of the substrate 1 include semiconductor substrates such as a silicon (Si) substrate. Examples of the inter layer dielectric 2 include a silicon oxide film ($SiO_2$) and a silicon nitride film (SiN).

FIG. 1A illustrates an X direction and a Y direction that are parallel to a surface of the substrate 1 and are perpendicular to each other, and a Z direction that is perpendicular to the surface of the substrate 1. In the present specification, a +Z direction is handled as an upward direction, and a −Z direction is handled as a downward direction. The −Z direction may be coincident with or not be coincident with a gravity direction.

Next, a first base layer 3 is formed on the inter layer dielectric 2 (FIG. 1A). The first base layer 3 is, for example, a spin on carbon (SOC) film having a thickness of 300 nm, and is formed by spin coating. The first base layer 3 may be directly formed on the substrate 1.

Next, a second base layer 4 is formed on the first base layer 3 (FIG. 1A). The second base layer 4 is, for example, a spin on glass (SOG) film having a thickness of 40 nm, and is formed by spin coating.

Next, an organic film 5 is formed on the second base layer 4 (FIG. 1A). The organic film 5 is a film containing carbon, and is, for example, a positive photoresist film. The organic film 5 of the present embodiment has a thickness of 100 nm and is formed by spin coating. The organic film 5 is an example of a first film.

Next, the organic film 5 is processed to an organic film pattern 5a (FIG. 1A). The organic film 5 is processed by, for example, photolithography using an ArF liquid immersion exposure apparatus. The organic film pattern 5a is an example of a first pattern.

In a process of FIG. 1A, the organic film 5 may be processed to a plurality of the organic film patterns 5a or to a single organic film pattern 5a. An example of the former includes that the organic patterns 5a become a plurality of line patterns, and openings in between the organic film patterns 5a become a plurality of space patterns. An example of the latter includes that openings in between the organic film pattern 5a become a plurality of hole patterns, and the organic film pattern 5a becomes a pattern surrounding the hole patterns. The organic film pattern 5a of the present embodiment corresponds to the example of the latter, and a plurality of contact holes (C/Hs) are provided as the hole patterns.

Next, the substrate 1 is housed in a vacuum chamber (not illustrated), pressure inside the vacuum chamber is reduced to 10 Pa, and the substrate 1 is heated to 50° C. At this time, temperature of the substrate 1 is desirably varied within a range of 0° C. to 300° C. depending on a kind of a precursor described later, and dimensions and density of the openings in the organic film pattern 5a.

Next, after the temperature of the substrate 1 is stabilized, an argon (Ar) gas is introduced into the vacuum chamber, and plasma discharge of the Ar gas is generated in the vacuum chamber. The Ar gas is an example of a first gas.

Figure 1B:
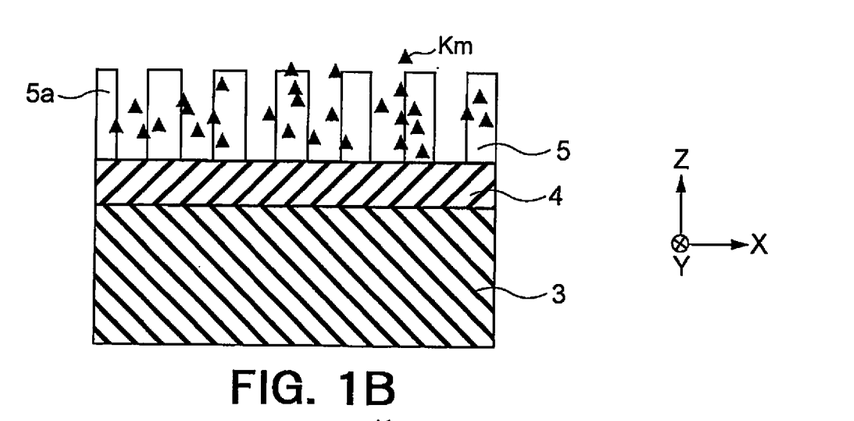

Next, after generation of the plasma discharge of the Ar gas is started, a metal gas is introduced into the vacuum chamber at pressure of 100 Pa, as illustrated by a reference sign "Km" (FIG. 1B). Examples of the metal gas include a trimethylaluminum (TMA) gas serving as an aluminum precursor. The metal gas is an example of a second gas containing a metal component. The metal component in this case is a TMA molecule.

The metal gas of the present embodiment is introduced into the vacuum chamber while products (excited bodies)

produced from the Ar gas exist in the vacuum chamber. As a result, the metal gas is activated by the products produced from the Ar gas, and is made easy to infiltrate into the organic film pattern 5a. Examples of the products include Ar ions and electrons.

As described above, in the present embodiment, the metal gas is indirectly activated through generation of the plasma discharge of the Ar gas, instead of direct activation of the metal gas through generation of the plasma discharge of the metal gas. More specifically, the metal gas is mixed with the products produced from the Ar gas in the vacuum chamber, which causes energy of the products to move to the metal gas, thereby being activated.

According to the present embodiment, generation of the plasma discharge of the Ar gas, not the metal gas, makes it possible to suppress decomposition of the metal gas. Decomposition of the metal gas causes an issue that decomposed products from the metal gas contaminates the vacuum chamber to inhibit plasma enhanced chemical vapor deposition (PECVD) and plasma enhanced atomic layer deposition (PEALD). According to the present embodiment, it is possible to suppress such the issue.

Next, to cause the metal gas to infiltrate into the entire organic film 5, the substrate 1 is left to stand for five minutes after introduction of the metal gas is started (FIG. 1B). At this time, a standing time of the substrate 1 is desirably changed within a range of one minute to 120 minutes depending on the kind of the precursor, and the dimensions and the density of the openings in the organic film pattern 5a.

Figure 1C:
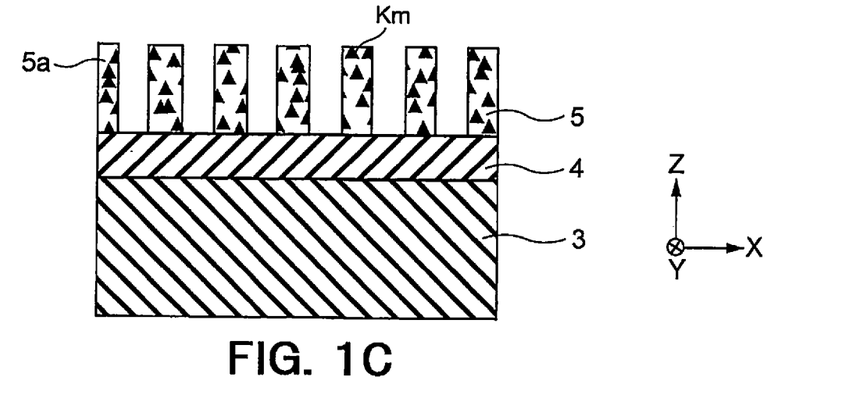

Next, the pressure inside the vacuum chamber is reduced to 10 Pa, and a surplus TMA gas is discharged from the vacuum chamber (FIG. 1C).

Figure 2A:
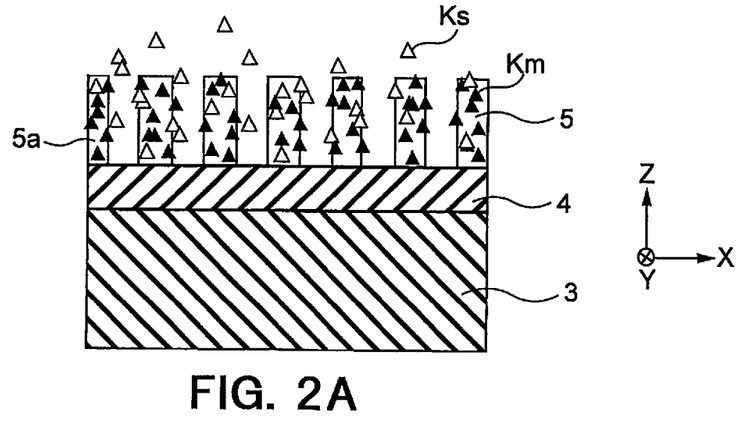

Next, as illustrated by a reference sign "Ks", steam is introduced into the vacuum chamber at pressure of 250 Pa (FIG. 2A). The steam is introduced in order to oxidize or reduce the metal components in the organic film 5. In the present embodiment, the steam is introduced in order to oxidize TMA. The steam is an example of a third gas.

Next, to sufficiently oxidize TMA in the organic film 5, the substrate 1 is left to stand for three minutes after introduction of the steam is started (FIG. 2A).

Figure 2B:
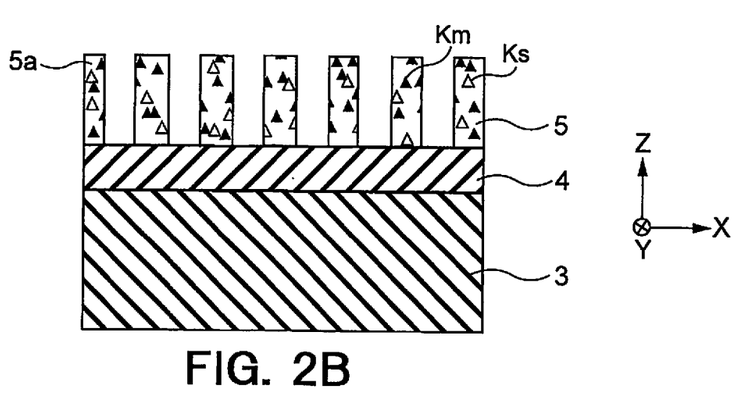

Next, the pressure inside the vacuum chamber is reduced to 10 Pa, surplus steam is discharged from the vacuum chamber, and the substrate 1 is cooled (FIG. 2B). As a result, the substrate 1 having the organic film pattern 5a into which aluminum has been introduced is obtained. In other words, the substrate 1 having the organic film pattern 5a metalized by aluminum is obtained. The organic film pattern 5a is used as a mask for etching of the second base layer 4, etc.

Figure 2C:
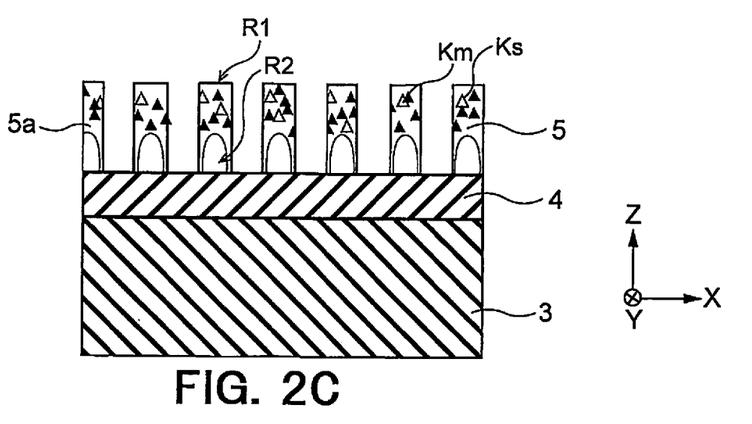

In a case of FIG. 2B, aluminum is uniformly distributed into the organic film pattern 5a. In contrast, in a case of FIG. 2C, aluminum is non-uniformly distributed into the organic film pattern 5a. FIG. 2C illustrates a region R1 infiltrated with TMA and a region R2 not infiltrated with TMA. Infiltration processing of the present embodiment may be performed so as to obtain the organic film pattern 5a of FIG. 2B, or may be performed so as to obtain the organic film pattern 5a of FIG. 2C. In the case of FIG. 2C, it is sufficient for TMA to infiltrate to an extent allowing the organic film pattern 5a to function as a mask.

FIGS. 3A to 3D are cross-sectional views illustrating a method of manufacturing a semiconductor device of a first comparative example of the first embodiment.

Figure 3A:
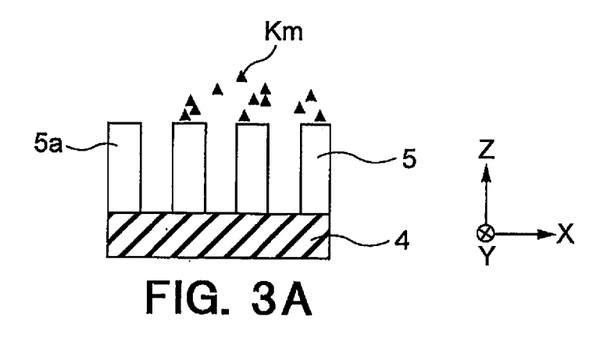
FIGS. 3A to 3D are cross-sectional views illustrating a method of manufacturing a semiconductor device of a first comparative example of the first embodiment.
Figure 3B:
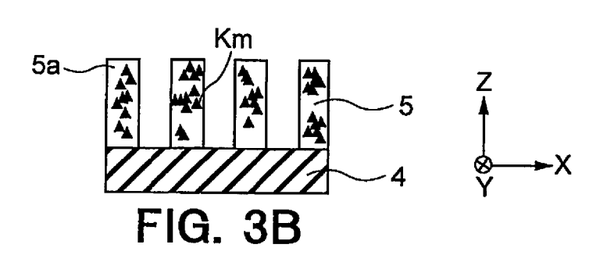
Figure 3C:
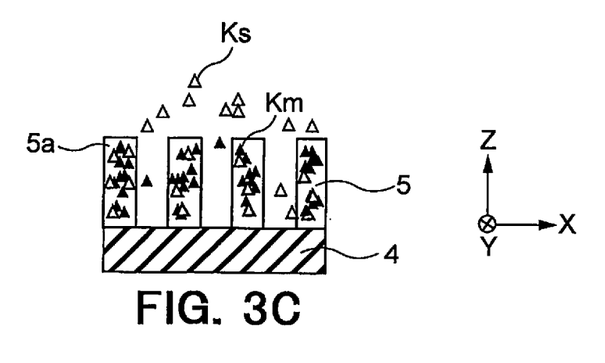

First, as with FIG. 1A, the organic film 5 is formed on the second base layer 4 (FIG. 3A). Next, the substrate 1 is housed in the vacuum chamber, and a metal gas is introduced into the vacuum chamber (FIG. 3B). As a result, the metal gas infiltrates into the organic film 5. Examples of the metal gas include a TMA gas. Next, steam is introduced into the vacuum chamber (FIG. 3C). As a result, TMA in the organic film 5 is oxidized, and the substrate 1 having the organic film pattern 5a metalized by aluminum is obtained.

Figure 3D:
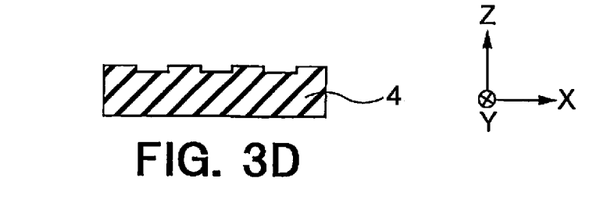

The organic film pattern 5a is used as a mask for etching of the second base layer 4, etc. In the present comparative example, however, the amount of TMA infiltrated into the organic film 5 is small, and etching resistance of the organic film 5 is low. Therefore, the organic film pattern 5a is removed in etching (FIG. 3D).

In contrast, in the present embodiment, the large amount of TMA infiltrates into the organic film 5 because the metal gas is indirectly activated, and the etching resistance of the organic film 5 is accordingly enhanced. This makes it possible to prevent the organic film pattern 5a from being removed in etching.

FIGS. 4A to 4D are cross-sectional views illustrating a method of manufacturing a semiconductor device of a second comparative example of the first embodiment.

Figure 4A:
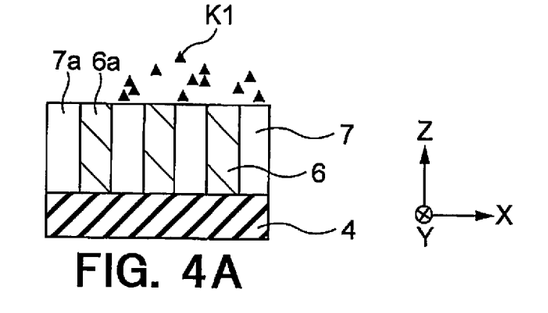
FIGS. 4A to 4D are cross-sectional views illustrating a method of manufacturing a semiconductor device of a second comparative example of the first embodiment.

First, after the second base layer 4 is formed as with FIG. 1A, a resin film 6 is formed on the second base layer 4 (FIG. 4A). The resin film 6 is, for example, a photocurable resin film having a thickness of 100 nm, and is formed by spin coating. Next, the resin film 6 is processed to a plurality of resin film patterns 6a through imprinting using a quartz mold and ultraviolet irradiation of the resin film 6 (FIG. 4A). Examples of the resin film patterns 6a include a plurality of pillar patterns. The quartz mold is released from the resin film 6 after the resin film 6 is cured through ultraviolet irradiation.

Next, a neutralized film (not illustrated) is formed on the second base layer 4 by spin coating with use of the resin film 6 as a guide, and a surplus neutralized film is cleaned with cyclohexane. Next, an organic film 7 is formed on the second base layer 4 with the neutralized film in between with use of the resin film 6 as a guide (FIG. 4A). The organic film 7 is, for example, a polystyrene-polymethyl methacrylate copolymer film, and is formed by spin coating. Next, the organic film 7 is baked at 230° C. to cause phase separation in the polystyrene-polymethyl methacrylate copolymer film to obtain a DSA (self-organized) film having a thickness of 80 nm. As illustrated in FIG. 4A, an organic film pattern 7a composed of the organic film 7 is formed in between the resin film patterns 6a. In FIG. 4A, one organic film pattern 7a surrounds the plurality of resin film patterns 6a.

Figure 4B:
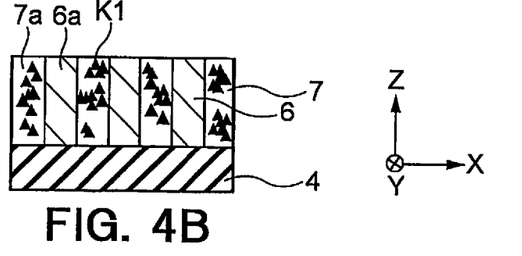
Figure 4C:
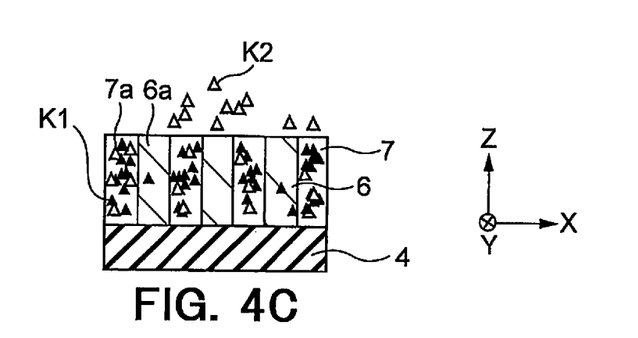

Next, the substrate 1 is housed in the vacuum chamber, and a metal gas is introduced into the vacuum chamber (FIG. 4B). As a result, the metal gas infiltrates into the organic film 7. Examples of the metal gas include a TMA gas. Next, steam is introduced into the vacuum chamber (FIG. 4C). As a result, TMA in the organic film 7 is oxidized, and the substrate 1 having the organic film pattern 7a metalized by aluminum is obtained.

Figure 4D:
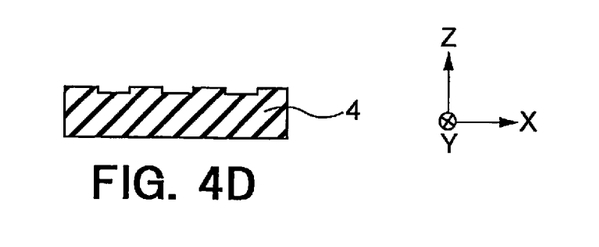

The organic film pattern 7a is used as a mask for etching of the second base layer 4, etc. In the present comparative example, however, the amount of TMA infiltrated into the organic film 7 is small, and etching resistance of the organic film 7 is low. Therefore, the organic film pattern 7a is removed in etching (FIG. 4D).

In contrast, in the present embodiment, the large amount of TMA infiltrates into the organic film 5 because the metal gas is indirectly activated, and the etching resistance of the organic film 5 is accordingly enhanced. This makes it possible to prevent the organic film pattern 5a from being removed in etching. The method of the present embodiment is applicable to the organic film 7 of the second comparative example as described later.

Modifications of First Embodiment

In the above description, the example of the organic film 5 is a photoresist film, the example of the metal gas is a TMA gas, and the example of the plasma discharge condition is 50° C. for five minutes. In this case, according to an experiment, a metal content of the organic film 5 was 32%. When the plasma discharge condition was changed to 100° C. for five minutes, the metal content of the organic film 5 was 36%. Further, when the plasma discharge condition was changed to 50° C. for two minutes, the metal content of the organic film 5 was 30%. As described above, it was made clear that the present embodiment provides the organic film 5 having a preferred metal content.

The organic film 5, the metal gas, and the plasma discharge condition of the present embodiment, however, are not limited to these examples. In the following, various modifications of the present embodiment are described.

In a first modification, the organic film 5 was replaced with the organic film 7, a TMA gas was used as the metal gas, and the plasma discharge condition was set to 50° C. for five minutes. In this case, according to the experiment, a metal content of the organic film 7 was 34%. When the plasma discharge condition was changed to 120° C. for five minutes, the metal content of the organic film 7 was 38%. Further, when the plasma discharge condition was changed to 50° C. for two minutes, the metal content of the organic film 7 was 29%.

In a second modification, an SOC film was used as the organic film 5, a TMA gas was used as the metal gas, and the plasma discharge condition was set to 200° C. for ten minutes. In this case, according to the experiment, the metal content of the organic film 5 was 22%. When the plasma discharge condition was changed to 150° C. for ten minutes, the metal content of the organic film 5 was 17%. Further, when the plasma discharge condition was changed to 100° C. for 30 minutes, the metal content of the organic film 5 was 18%.

In a third modification, an amorphous carbon film (APF) was used as the organic film 5, a TMA gas was used as the metal gas, and the plasma discharge condition was set to 200° C. for 30 minutes. In this case, according to the experiment, the metal content of the organic film 5 was 24%. When the plasma discharge condition was changed to 200° C. for ten minutes, the metal content of the organic film 5 was 20%. Further, when the plasma discharge condition was changed to 150° C. for 30 minutes, the metal content of the organic film 5 was 21%.

In a fourth modification, a photoresist film was used as the organic film 5, a $WF_6$ (tungsten hexafluoride) gas was used as the metal gas, and the plasma discharge condition was set to 250° C. for five minutes. In this case, according to the experiment, the metal content of the organic film 5 was 18%.

In a fifth modification, a photoresist film was used as the organic film 5, a TDMAT (tetrakis dimethylamino titanium) gas was used as the metal gas, and the plasma discharge condition was set to 250° C. for five minutes. In this case, according to the experiment, the metal content of the organic film 5 was 23%.

In a sixth modification, a photoresist film was used as the organic film 5, a PDMAT (pentakis(dimethylamino)tantalum) gas was used as the metal gas, and the plasma discharge condition was set to 200° C. for five minutes. In this case, according to the experiment, the metal content of the organic film 5 was 26%.

In a seventh modification, a photoresist film was used as the organic film 5, a RDE ((2,4-dimethylpentadienyl)(ethylpentadienyl)ruthenium) gas was used as the metal gas, and the plasma discharge condition was set to 150° C. for ten minutes. In this case, according to the experiment, the metal content of the organic film 5 was 21%.

In these modifications, plasma discharge of the Ar gas is generated in the vacuum chamber to indirectly activate the metal gas. In contrast, in eighth and ninth modifications described later, radiation is applied to the Ar gas in the vacuum chamber to indirectly activate the metal gas. Examples of such radiations include particle beams such as electron beams, and electromagnetic waves such as light rays and ultraviolet rays. A method of setting temperature in radiation application and a method of setting start timing and end timing of the radiation application are similar to those in the plasma discharge.

In the eighth modification, a photoresist film was used as the organic film 5, a TMA gas was used as the metal gas, and an electron beam irradiation condition was set to 50° C. for five minutes. In this case, according to the experiment, the metal content of the organic film 5 was 31%. When the electron beam irradiation condition was changed to 100° C. for ten minutes, the metal content of the organic film 5 was 32%. Further, when the electron beam irradiation condition was changed to 50° C. for two minutes, the metal content of the organic film 5 was 27%.

In the ninth modification, the organic film 5 was replaced with the organic film 7, a TMA gas was used as the metal gas, and the electron beam irradiation condition was set to 50° C. for five minutes. In this case, according to the experiment, the metal content of the organic film 7 was 31%. When the electron beam irradiation condition was changed to 120° C. for five minutes, the metal content of the organic film 7 was 31%. Further, when the electron beam irradiation condition was changed to 50° C. for two minutes, the metal content of the organic film 7 was 27%.

According to the experiments, in a case of adopting the method of the present embodiment and the modifications thereof, it was made clear that the organic film 5 (or organic film 7) having a preferred metal content is obtainable under the plasma discharge condition or the radiation irradiation condition at low temperature for a short time.

As described above, in the present embodiment, the Ar gas is activated through the plasma discharge or the radiation application, and the metal gas is activated with use of the Ar gas. Therefore, according to the present embodiment, it is possible to appropriately promote infiltration of the metal gas into the organic film 5. For example, it is possible to promote infiltration of the metal gas into the organic film 5 while suppressing decomposition of the metal gas. As a result, it is possible to form the organic film 5 having high etching resistance by the processing at low temperature for a short time, which allows for reduction of the manufacturing cost of the semiconductor device.

The gas as a target of the plasma discharge and the radiation application may be a gas other than the Ar gas. Examples of such a gas include noble gases other than the Ar gas.

Second Embodiment

FIGS. 5A to 7B are cross-sectional views illustrating operation of a semiconductor manufacturing apparatus of a second embodiment.

Figure 5A:
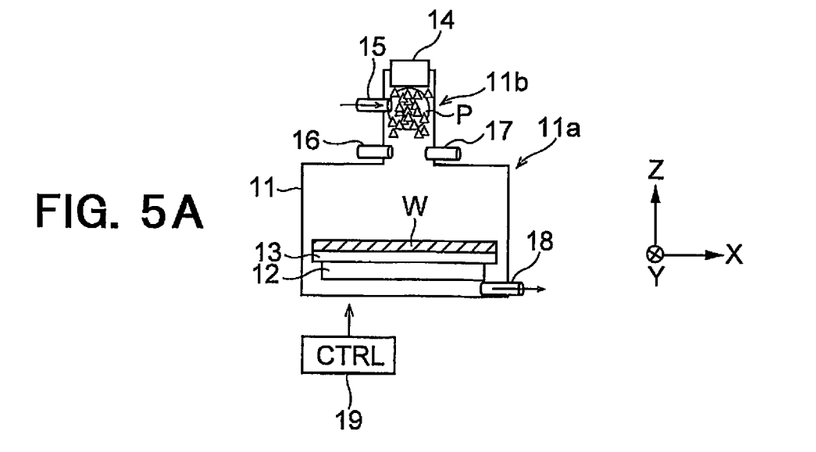

The semiconductor manufacturing apparatus of the present embodiment is used to perform the plasma discharge and the metallization in the first embodiment. As illustrated in FIG. 5A, the semiconductor manufacturing apparatus includes a chamber 11, a stage 12, a heater 13, a plasma source 14, a first gas introduction module 15, a second gas introduction module 16, a steam introduction module 17, a discharge module 18, and a controller 19.

The chamber 11 includes a first portion 11a housing the substrate 1 including the organic film pattern 5a and a second portion 11b protruding from the first portion 11a. FIG. 5A illustrates a state where a wafer "W" composed of the substrate 1, the inter layer dielectric 2, the organic film pattern 5a, and the like is housed in the first portion 11a. The chamber 11 is used as the vacuum chamber described in the first embodiment. The Ar gas, the metal gas, and the steam are introduced into the second portion 11b, and flow from the second portion 11b into the first portion 11a.

The stage 12 supports the substrate 1 in the chamber 11. The stage 12 can vertically move the substrate 1. This facilitates carrying the substrate 1 into and out of the semiconductor manufacturing apparatus.

The heater 13 configures a part of the stage 12, and can heat the substrate 1 on the stage 12.

The plasma source 14 is a mechanism generating the plasma discharge of the Ar gas in the second portion 11b. The products. (excited bodies) produced from the Ar gas in the second portion 11b enter the first portion 11a from the second portion 11b. The excited bodies, however, are deactivated before reaching the substrate 1 because the second portion 11b of the present embodiment is sufficiently separated from the stage 12. The plasma source 14 is an example of a gas processing module.

The first gas introduction module 15 is located in the second portion 11b, and introduces the Ar gas into the second portion 11b. The second gas introduction module 16 is located in the second portion 11b, and introduces the metal gas into the second portion 11b. The steam introduction module 17 is located in the second portion 11b, and introduces the steam into the second portion 11b. The discharge module 18 is located in the first portion 11a, and discharges the gas from the chamber 11 to outside. An intake mechanism (not illustrated) to take in the gas from the chamber 11 is connected to the discharge module 18.

The first gas introduction module 15 is located at a first distance from the stage 12, and the second gas introduction module 16 is located at a second distance from the stage 12 which is smaller than the first distance. In other words, the second distance between the second gas introduction module 16 and the stage 12 is smaller than the first distance between the first gas introduction module 15 and the stage 12.

Accordingly, the Ar gas that has been introduced from the first gas introduction module 15 into the second portion 11b is changed to excited bodies. The excited bodies subsequently pass through a region where the metal gas exists in high concentration, and then enter the first portion 11a. This makes it possible to efficiently move the energy of the excited bodies to the metal gas.

The first distance between the first gas introduction module 15 and the stage 12 is set to a distance that deactivates the excited bodies before the excited bodies reach the organic film pattern 5a. This makes it possible to suppress the excited bodies from adversely affecting the organic film pattern 5a.

The controller 19 controls various operation of the semiconductor manufacturing apparatus. The controller 19 controls, for example, vertical movement of the stage 12, temperature of the heater 13, operation of the plasma source 14, gas introduction from the first gas introduction module 15, the second gas introduction module 16, and the steam introduction module 17, and a gas discharge from the discharge module 18. The controller 19 of the present embodiment controls operation of the heater 13 so as to vary the temperature of the substrate 1 within a range of 0° C. to 300° C. Examples of the controller 19 include a processor, an electric circuit, and a computer.

The operation of the semiconductor manufacturing apparatus of the present embodiment is described below.

First, after the substrate 1 (wafer "W") is housed in the first portion 11a, the Ar gas is introduced from the first gas introduction module 15 into the second portion 11b, and the plasma source 14 generates the plasma discharge of the Ar gas (FIG. 5A). White triangles illustrated in FIG. 5A indicate Ar atoms and Ar plasma produced from the Ar atoms. Further, a reference sign "P" schematically illustrates a region where the plasma discharge is generated.

Figure 5B:
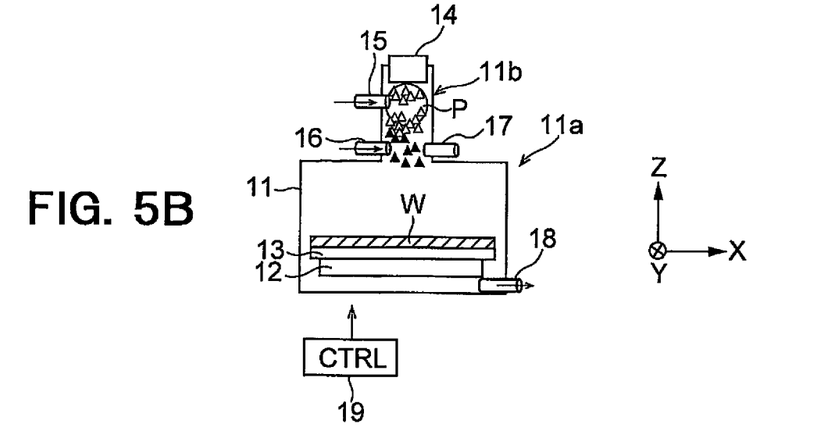
Figure 5C:
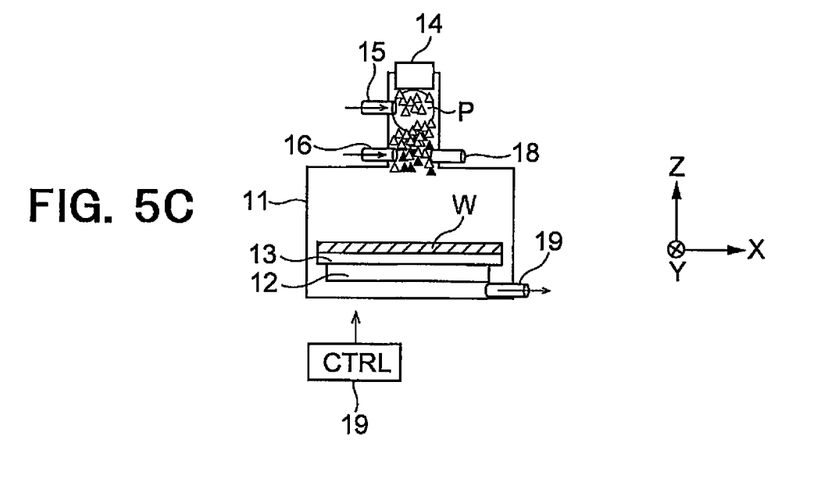

Next, after generation of the plasma discharge is confirmed, the metal gas is introduced from the second gas introduction module 16 into the second portion 11b (FIG. 5B). Black triangles illustrated in FIG. 5B indicate TMA molecules in the metal gas. The TMA molecules collide with ion species of the Ar plasm flowing from upstream side, thereby being energetically activated (FIG. 5C).

Figure 6A:
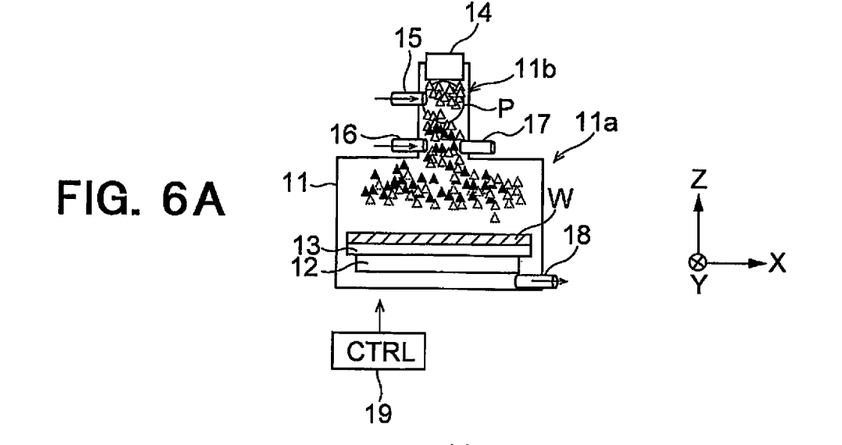
Figure 6B:
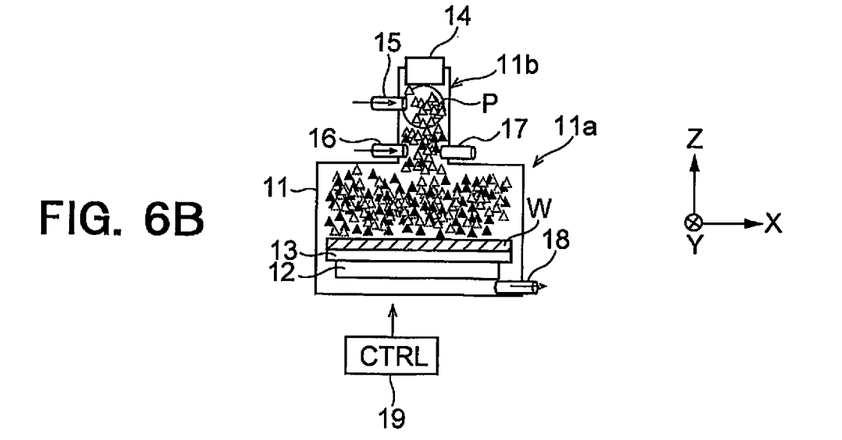

The activated TMA molecules arrive at the vicinity of the substrate 1 (FIGS. 6A and 6B). In contrast, the Ar plasma is deactivated before arriving at the vicinity of the substrate 1 due to collision with the TMA molecules and the distance between the first gas introduction module 15 and the stage 12, and returns to normal Ar atoms. This makes it possible to suppress collision of the Ar plasma with the organic film pattern 5a. Dotted triangles illustrated in FIGS. 6A and 6B indicate the Ar atoms deactivated from the Ar plasma. In the present embodiment, the distance between the plasma source 14 and the substrate 1 is large in order to promote deactivation of the Ar plasma, and is specifically set to 30 cm.

Figure 6C:
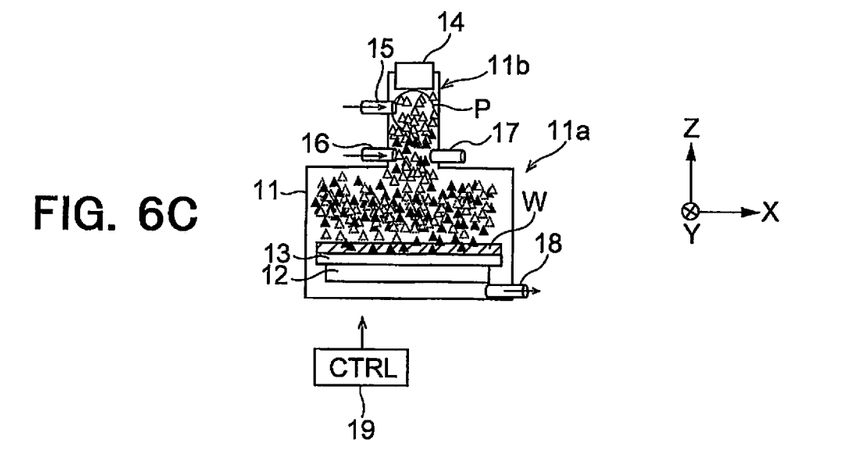
Figure 7A:
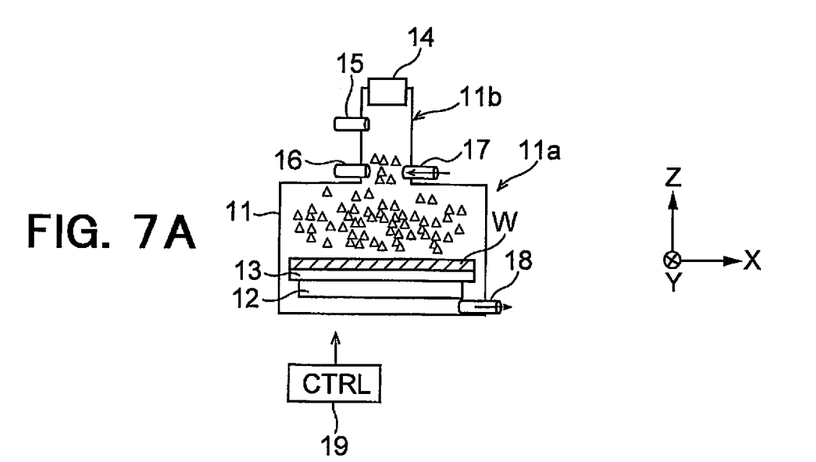

Next, to cause the metal gas arriving at the organic film pattern 5a to infiltrate into the organic film pattern 5a, the state is maintained for five minutes (FIG. 6C). Next, to oxidize TMA in the organic film pattern 5a, steam is introduced from the steam introduction module 17 into the second portion 11b, and the state is maintained for three minutes (FIG. 7A).

Figure 7B:
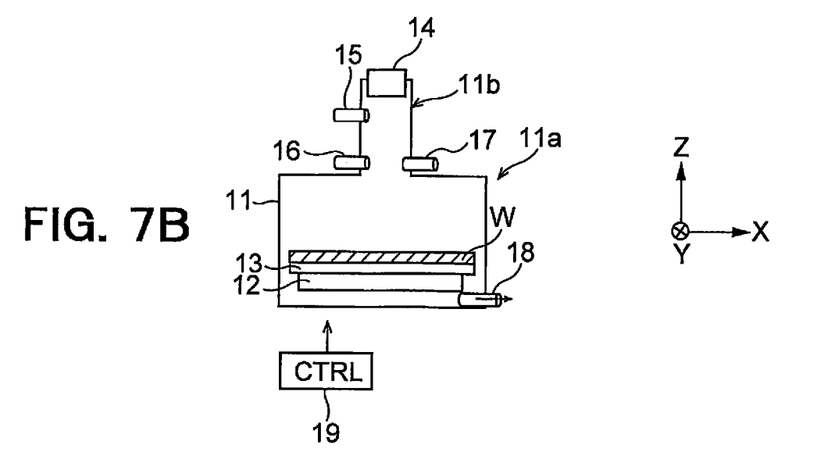

Next, the pressure inside the chamber 11 is reduced to 10 Pa, surplus steam is discharged through the discharge module 18, and further the substrate 1 is cooled (FIG. 7B). In the present embodiment, the substrate 1 is cooled by stopping the heater 13 or reducing the temperature of the heater 13. As a result, the substrate 1 having the organic film pattern 5a into which aluminum has been introduced is obtained.

The semiconductor manufacturing apparatus of the present embodiment makes it possible to appropriately promote infiltration of the metal gas into the organic film 5 when the method of the first embodiment is performed.

Third Embodiment

FIGS. 8A to 10 are cross-sectional views illustrating operation of a semiconductor manufacturing apparatus of a third embodiment.

Figure 8A:
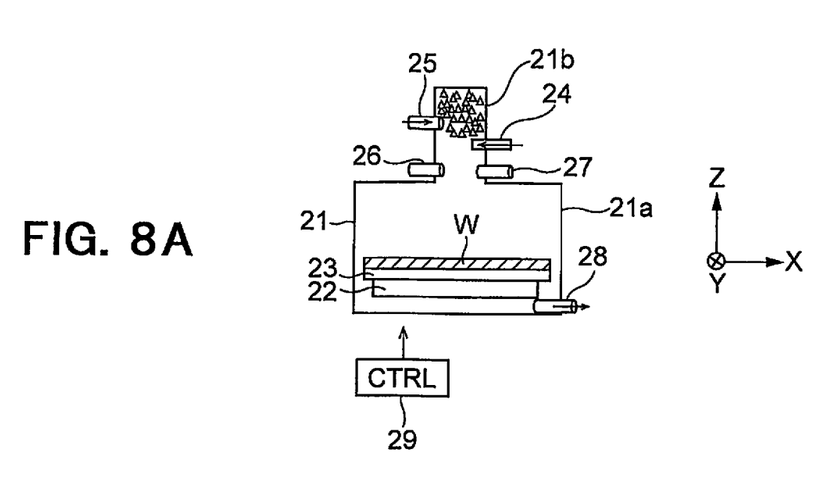

The semiconductor manufacturing apparatus of the present embodiment is used to perform the radiation application and the metallization in the modifications of the first embodiment. As illustrated in FIG. 8A, the semiconductor manufacturing apparatus includes a chamber 21, a stage 22, a heater 23, a radiation source 24, a first gas introduction module 25, a second gas introduction module 26, a steam introduction module 27, a discharge module 28, and a controller 29. The chamber 21 includes a first portion 21a and a second portion 21b. Functions of the respective modules are similar to the corresponding modules of the semiconductor manufacturing apparatus of the second embodiment except for the radiation source 24.

The radiation source 24 is a mechanism to apply radiation (electron beams in this case) to the Ar gas in the second portion 21b. The products (excited bodies) produced from the Ar gas in the second portion 21b enter the first portion 21a from the second portion 21b. As with the second embodiment, the excited bodies are deactivated before arriving at the substrate 1 because the second portion 21b of the present embodiment is sufficiently separated from the stage 22. The radiation source 24 is an example of the gas processing module.

Operation of the semiconductor manufacturing apparatus of the present embodiment is described below.

Figure 8B:
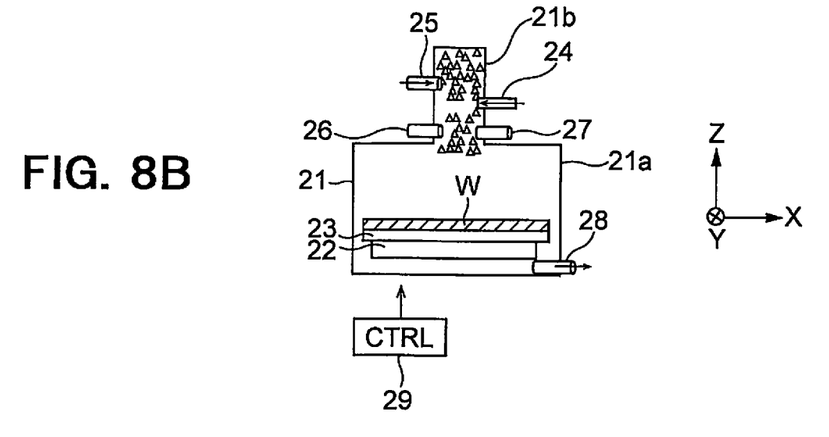

First, after the substrate 1 (wafer "W") is housed in the first portion 21a, the Ar gas is introduced from the first gas introduction module 25 into the second portion 21b (FIG. 8A), and the radiation source 24 applies electron beams to the Ar gas (FIG. 8B). White triangles illustrated in FIGS. 8A and 8B indicate Ar atoms and Ar ion species produced from the Ar atoms. The Ar atoms are ionized by electron beam application and are highly activated.

Figure 8C:
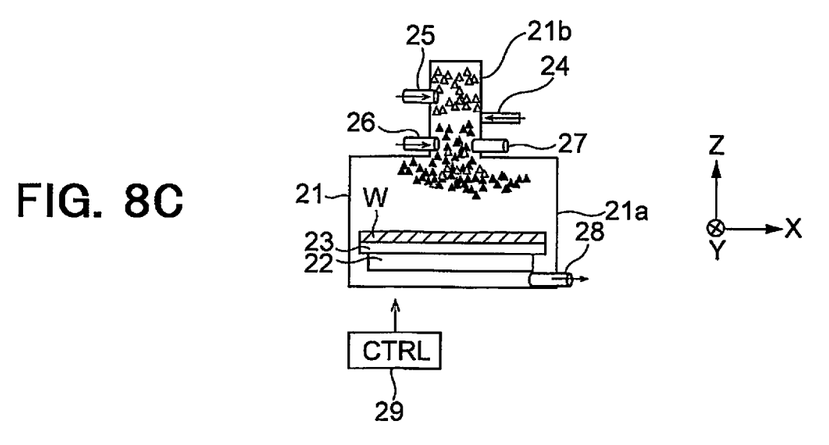

Next, the metal gas is introduced from the second gas introduction module 26 into the second portion 21b (FIG. 8C). Black triangles illustrated in FIG. 8C indicate TMA molecules in the metal gas. The TMA molecules collide with Ar ions flowing from upstream side, thereby being energetically activated (FIG. 8C).

Figure 9A:
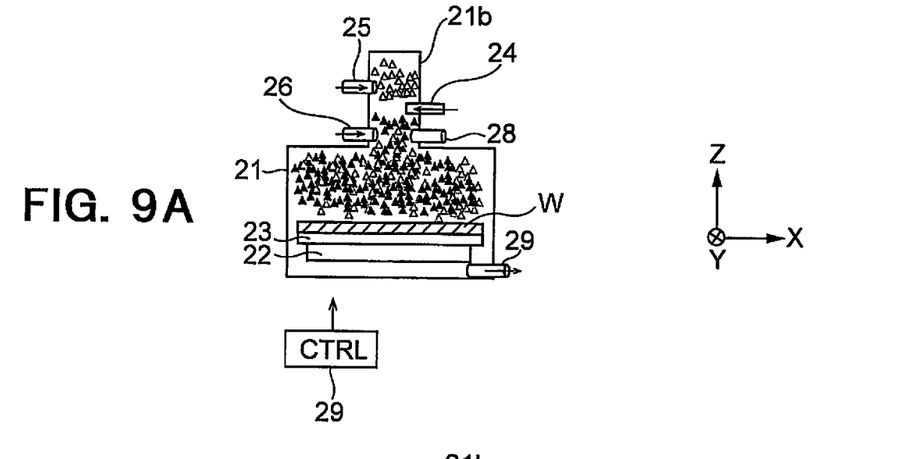

The activated TMA molecules arrive at the vicinity of the substrate 1 (FIG. 9A). In contrast, the Ar ions are deactivated before arriving at the vicinity of the substrate 1 due to collision with the TMA molecules and the distance between the first gas introduction module 25 and the stage 22, and return to normal Ar atoms. This makes it possible to suppress collision of the Ar ions with the organic film pattern 5a. Dotted triangles illustrated in FIG. 9A indicate the Ar atoms deactivated from the Ar ions. In the present embodiment, the distance between the radiation source 24 and the substrate 1 is large in order to promote deactivation of the Ar ions, and is specifically set to 30 cm.

Figure 9B:
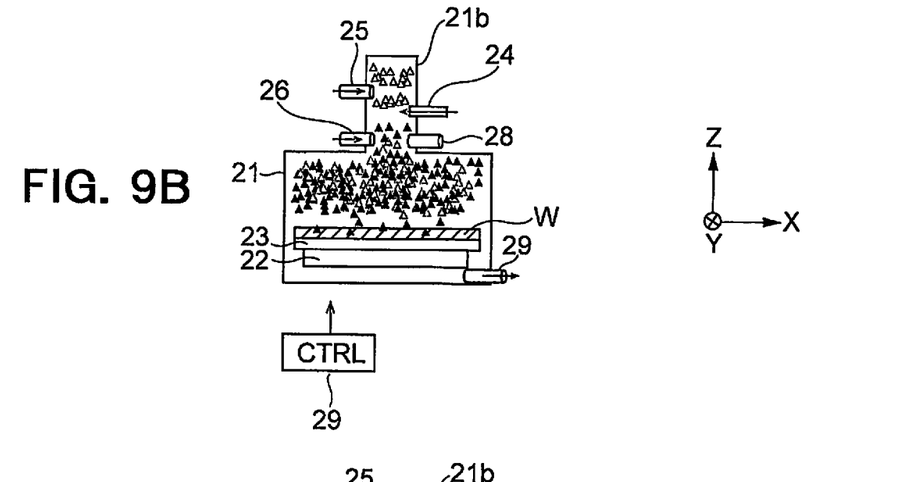
Figure 9C:
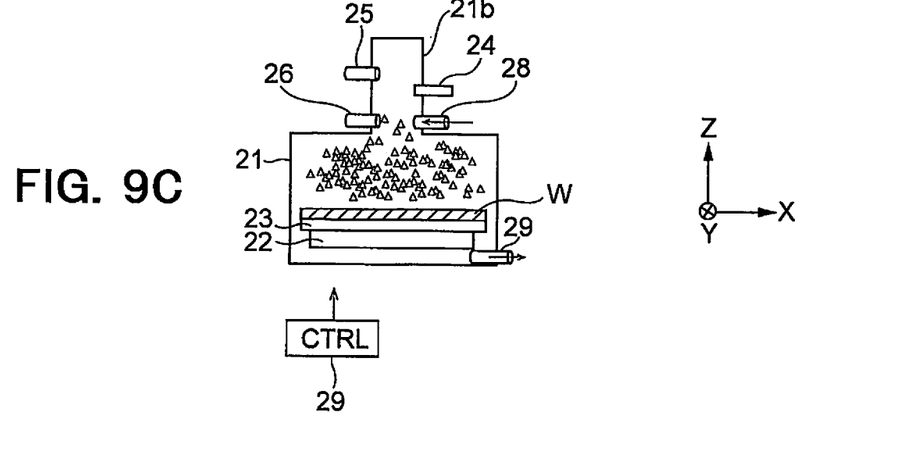

Next, to cause the metal gas arriving at the organic film pattern 5a to filtrate into the organic film pattern 5a, the state is maintained for five minutes (FIG. 9B). Next, to oxidize TMA in the organic film pattern 5a, steam is introduced from the steam introduction module 27 into the second portion 21b, and the state is maintained for three minutes (FIG. 9C).

Figure 10:
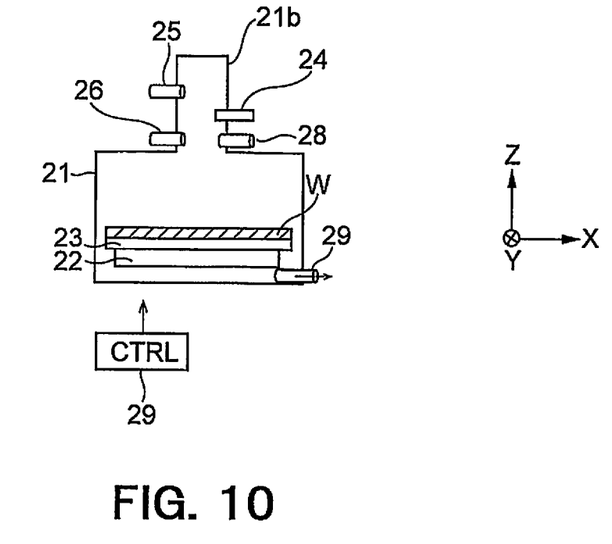

Next, the pressure inside the chamber 21 is reduced to 10 Pa, surplus steam is discharged through the discharge module 28, and further the substrate 1 is cooled (FIG. 10). In the present embodiment, the substrate 1 is cooled by stopping the heater 23 or reducing the temperature of the heater 23. As a result, the substrate 1 having the organic film pattern 5a into which aluminum has been introduced is obtained.

The semiconductor manufacturing apparatus of the present embodiment makes it possible to appropriately promote infiltration of the metal gas into the organic film 5 when the method in the modifications of the first embodiment is performed.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and apparatuses described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a chamber that houses a substrate provided with a first film;
   a first gas introduction module that introduces a first gas into the chamber;
   a gas processing module that generates plasma discharge of the first gas in the chamber or applies radiation to the first gas in the chamber;
   a second gas introduction module introduces a second gas containing a metal component into the chamber to cause the metal component to infiltrate into the first film; and
   a third gas introduction module that introduces, into the chamber, a third gas that oxidizes or reduces the metal component infiltrated into the first film,
   wherein
      the first gas introduction module is located at a first distance from a stage that supports the substrate, and
      the third gas introduction module is located at a third distance from the stage, the third distance being smaller than the first distance.

2. The apparatus of claim 1, wherein
   the substrate is housed in the chamber after a first pattern is formed on the first film, and
   the metal component infiltrates into the first pattern.

3. The apparatus of claim 1, wherein the first gas is a noble gas.

4. The apparatus of claim 1, wherein the second gas is introduced into the chamber that contains a product produced from the first gas.

5. The apparatus of claim 1, wherein the first film is a film containing carbon.

6. The apparatus of claim 1, wherein the first film includes at least one of a photoresist film, a self-organized film, a spin on carbon film and an amorphous carbon film.

7. The apparatus of claim 1, wherein
   the second gas introduction module is located at a second distance from the stage, the second distance being smaller than the first distance.

8. The apparatus of claim 7, wherein the first distance is a distance deactivating a product produced from the first gas before the product arrives at the first film.

9. The apparatus of claim 1, wherein the chamber includes a first portion housing the substrate, and a second portion provided with first and second inlets from which the first and second gases are introduced into the second portion, respectively, the second portion protruding from the first portion.

10. A semiconductor manufacturing apparatus comprising:
    a chamber that houses a substrate provided with a first film;
    a first gas introduction module that introduces a first gas into the chamber;
    a gas processing module that generates plasma discharge of the first gas in the chamber;

a second gas introduction module that introduces a second gas containing a metal component into the chamber; and a third gas introduction module that introduces, into the chamber, a third gas that oxidizes or reduces the metal component infiltrated into the first film, wherein the first gas introduction module is located at a first distance from a stage that supports the substrate, the second gas introduction module is located at a second distance from the stage, the second distance being smaller than the first distance, and the third gas introduction module is located at a third distance from the stage, the third distance being smaller than the first distance.

11. A semiconductor manufacturing apparatus comprising:

a chamber that houses a substrate provided with a first film;

a first gas introduction module that introduces a first gas into the chamber;

a gas processing module that applies radiation to the first gas in the chamber;

a second gas introduction module that introduces a second gas containing a metal component into the chamber; and a third gas introduction module that introduces, into the chamber, a third gas that oxidizes or reduces the metal component infiltrated into the first film, wherein the first gas introduction module is located at a first distance from a stage that supports the substrate, and the third gas introduction module is located at a third distance from the stage, the third distance being smaller than the first distance.

12. The apparatus of claim 1, wherein the first gas introduction module is provided to be distant from the gas processing module.

13. The apparatus of claim 10, wherein the first gas introduction module is provided to be distant from the gas processing module.

* * * * *